United States Patent
Minamio et al.

(10) Patent No.: US 7,563,644 B2
(45) Date of Patent: Jul. 21, 2009

(54) OPTICAL DEVICE AND METHOD FOR FABRICATING THE SAME

(75) Inventors: Masanori Minamio, Osaka (JP); Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/191,639

(22) Filed: Aug. 14, 2008

(65) Prior Publication Data

US 2008/0304790 A1    Dec. 11, 2008

Related U.S. Application Data

(62) Division of application No. 11/102,736, filed on Apr. 11, 2005, now Pat. No. 7,436,053.

(30) Foreign Application Priority Data

May 14, 2004    (JP) ............................... 2004-144523

(51) Int. Cl.
*H01L 21/44* (2006.01)
*H01L 21/48* (2006.01)

(52) U.S. Cl. ..................... 438/116; 438/112; 438/124; 438/26; 438/51; 257/E21.502

(58) Field of Classification Search ............... 438/116, 438/112, 124, 26, 51; 257/680, 98, 100, 257/E21.502

See application file for complete search history.

(56) References Cited

U.S. PATENT DOCUMENTS

| | | | | |
|---|---|---|---|---|
| 4,766,095 A | * | 8/1988 | Hiroshi | 438/116 |
| 4,769,344 A | * | 9/1988 | Sakai et al. | 29/827 |
| 4,874,722 A | * | 10/1989 | Bednarz et al. | 29/825 |
| 5,264,393 A | * | 11/1993 | Tamura et al. | 438/64 |
| 6,147,389 A | | 11/2000 | Stern et al. | |
| 6,489,178 B2 | * | 12/2002 | Coyle et al. | 438/51 |
| 6,495,895 B1 | | 12/2002 | Peterson et al. | |
| 6,621,616 B1 | | 9/2003 | Bauer et al. | |
| 7,166,907 B2 | | 1/2007 | Onishi et al. | |
| 2003/0128442 A1 | | 7/2003 | Tanaka et al. | |
| 2003/0136968 A1 | * | 7/2003 | Fjelstad | 257/82 |
| 2005/0105860 A1 | | 5/2005 | Oono et al. | |
| 2005/0179102 A1 | | 8/2005 | Weiblen et al. | |

FOREIGN PATENT DOCUMENTS

JP    2000-58805    2/2000
JP    2002-43554    2/2002

OTHER PUBLICATIONS

Foreign Office Action and English Translation thereof dated Aug. 3, 2007, for Japanese Patent Application No. 200510071238.4.

* cited by examiner

*Primary Examiner*—Nitin Parekh
(74) *Attorney, Agent, or Firm*—McDermott Will & Emery LLP

(57) ABSTRACT

An optical device includes a base, an optical element chip attached to the base, an integrated circuit chip attached onto the back surface of the optical element chip, and a translucent member (window member). A wire is buried within the base, and the wire has an internal terminal portion, an external terminal portion, and a midpoint terminal portion. A pad electrode of the optical element chip is connected to the internal terminal portion through a bump, and a pad electrode of the integrated circuit chip is connected to the midpoint terminal portion through a fine metal wire.

4 Claims, 7 Drawing Sheets

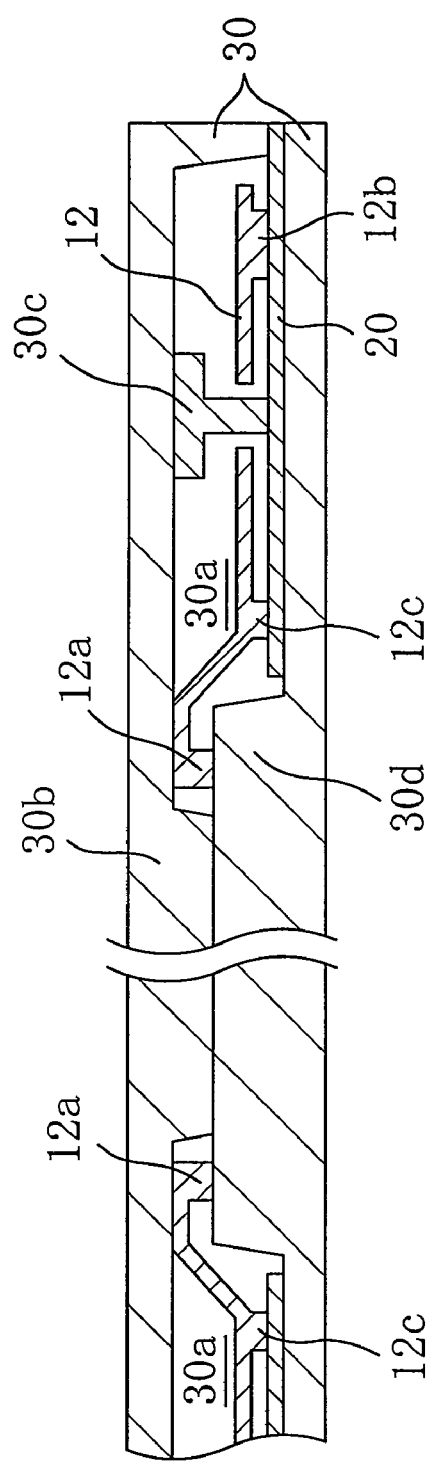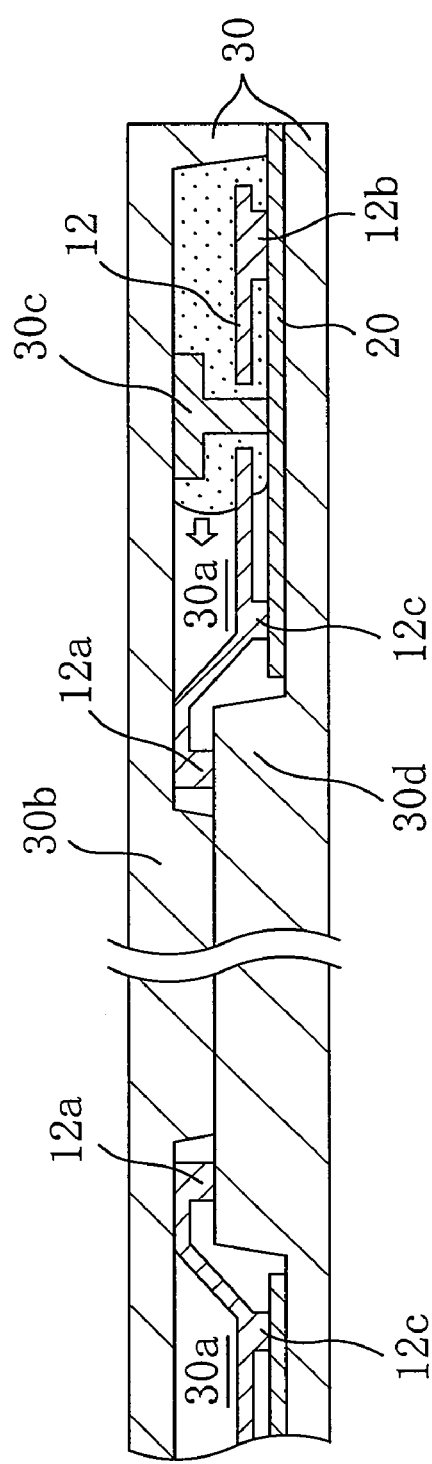

OPTICAL DEVICE AND METHOD FOR FABRICATING THE SAME

CROSS-REFERENCE TO RELATED APPLICATIONS

This application is a Divisional of U.S. Ser. No. 11/102,736, filed Apr. 11, 2005, now U.S. Pat. No. 7,436,053 and claims priority under 35 U.S.C. § 119(a) Japanese Patent Application No. 2004-144523 filed in Japan on May 14, 2004, the entire contents of each of which are hereby incorporated by reference.

BACKGROUND OF THE INVENTION (a) Fields of the Invention

The present invention relates to optical devices such as solid-state image sensing devices, light receiving devices used for optical pickup systems, and hologram units, and to methods for fabricating such a device.

(b) Description of Related Art

In recent years, optical devices built in camcorders, digital cameras, digital still cameras, and the like have been provided in a package form produced in such a manner that an image sensing element such as a CCD is mounted on an adapter component such as a base of an insulating material and that the mounted image sensing element is packaged with its light receiving region covered with a translucent plate.

In order to downsize an optical device, an image sensing element remaining in a bare chip form is mounted on an adapter component such as a base (see, for example, Japanese Unexamined Patent Publication No. 2000-58805).

FIG. 7 is a sectional view showing the structure of a known optical device. Referring to FIG. 7, the optical device includes, as main components, a base 131 of frame shape, an image sensing element 135, and a translucent plate 136. The base 131 is made of ceramic or plastic resin and has an opening 132 in its center portion. The image sensing element 135 is formed of, for example, a CCD and attached to the lower surface of the base 131. The translucent plate 136 is made of glass and attached to the upper surface of the base 131 so that the plate faces the image sensing element 135 with the opening 132 interposed therebetween.

A region of the lower surface of the base 131 located along the edge of the opening 132 is formed with a recess 133, and wires 134 of a gold plated layer are each provided to extend from the vicinity of the opening 132 on the lower surface of the base 131 to the outside surface of the base 131. The image sensing element 135 is attached to a region of the lower surface of the base 131 located on the inner edge of the recess 133, and the element is disposed so that a light receiving region 135a thereof is exposed in the opening 132.

A portion of the upper surface of the image sensing element 135 located around its perimeter is provided with electrode pads (not shown) for sending and receiving signals between the image sensing element 135 and external equipment. An end of each wire 134 adjacent to the opening 132 is formed with an internal terminal portion. The internal terminal portion of each wire 134 and the corresponding electrode pad are electrically connected to each other with a bump (protruding electrode) 138 interposed therebetween. On the lower surface of the base 131, the image sensing element 135, the wires 134, and the bumps 138 are hermetically sealed with a sealing resin 137 provided around the image sensing element 135.

As shown above, the light receiving region 135a of the image sensing element 135 is disposed within a closed space formed together with the opening 132. The optical device thus constructed is mounted on a circuit board with the translucent plate 136 directed upward as shown in FIG. 7. A portion of each wire 134 located outside the recess 133 and on the bottom of the base 131 is formed with an external terminal portion, which is used for connection to an electrode on the circuit board.

Although not shown in FIG. 7, a lens barrel with an optical imaging system incorporated therein is fixed above the translucent plate 136. The positional relation between the lens barrel and the light receiving region 135a has a defined accuracy required to fall within a predetermined tolerance.

Then, through the optical imaging system incorporated in the lens barrel, light from an imaged object is concentrated on the light receiving region 135a of the image sensing element 135. The concentrated light is converted into electricity by the image sensing element 135.

Also, another exemplary optical device has been known which uses a base unlike the base 131 shown in FIG. 7, having the shape of a totally flat plate. The base does not have the recess 133 formed in its surface on which the image sensing element 135 is mounted (see, for example, Japanese Unexamined Patent Publication No. 2002-43554). In such a case, the external terminal portions arranged around the perimeter of the base bottom and positioned off the edge of the opening are connected to the electrodes on, the circuit board through great-diameter solder balls or the like, respectively. The solder balls adjust the gap between the lower surface of the image sensing element and the upper surface of the circuit board.

The solid-state image sensing device having the structure as described above provides a small package height and a small footprint, and is suitable for implementation with high packing density.

In addition, basically the same structure is applied also to optical devices such as light receiving devices for use in optical pickup systems for writing information in, reading information from, and rewriting information in a media including a DVD, a CD, and an MD, and hologram units integrating multiple components in an optical pickup.

SUMMARY OF THE INVENTION

The structure of the known optical device shown in FIG. 7, however, has not yet provided a satisfactorily high integration in terms of the whole system of a solid-state image sensing device, an optical pickup system, or the like, and still has room for improvement.

An object of the present invention is to provide an optical device with high integration and a method for fabricating such a device.

An optical device of the present invention comprises: a base having a shoulder in a region thereof located around an opening; an optical element chip and a translucent member attached to interpose the opening of the base; and a wire which has an internal terminal portion provided on the shoulder and bent up above an external terminal portion.

Thereby, the optical device with a small total thickness and a high integration can be provided. Furthermore, a system with the optical device incorporated therein can be totally downsized and manufacturing costs thereof can be reduced.

Upper and lower surfaces of the internal terminal portion are substantially flush with upper and lower surfaces of part of the base adjacent to the internal terminal portion, respectively, whereby a resin sealing process can be utilized to bend the internal terminal portion up.

The optical element chip is flip-chip bonded onto the terminal portion of the wire, whereby the optical device can be further downsized.

The wire preferably has a reinforcing terminal portion provided between the internal and external terminal portions.

An integrated circuit chip can also be provided on the back surface of the optical element chip.

A method for fabricating an optical device according to the present invention is carried out in the following manner. A lead frame with a wiring pattern is molded, and then optical element chips are attached to a plurality of optical device formation regions each surrounding an opening, respectively. Sealing is made between the optical element chips and respective bases, and a translucent member is attached to each of the bases so that the member faces the corresponding optical element chip with the opening interposed therebetween. In the sealing process, during the molding step, resin sealing is carried out with an internal terminal portion of the wiring pattern put on a projection of a lower die of a molding die and thereby sandwiched by an upper die and the lower die.

With this method, the optical device with a small total thickness and a high integration can be provided easily.

BRIEF DESCRIPTION OF THE DRAWINGS

FIGS. 3A and 3B are sectional views showing molding steps of the fabrication process of the optical device according to the first embodiment.

DETAILED DESCRIPTION OF THE PREFERRED EMBODIMENTS

First Embodiment

Structure of Optical Device

Figure 1A:
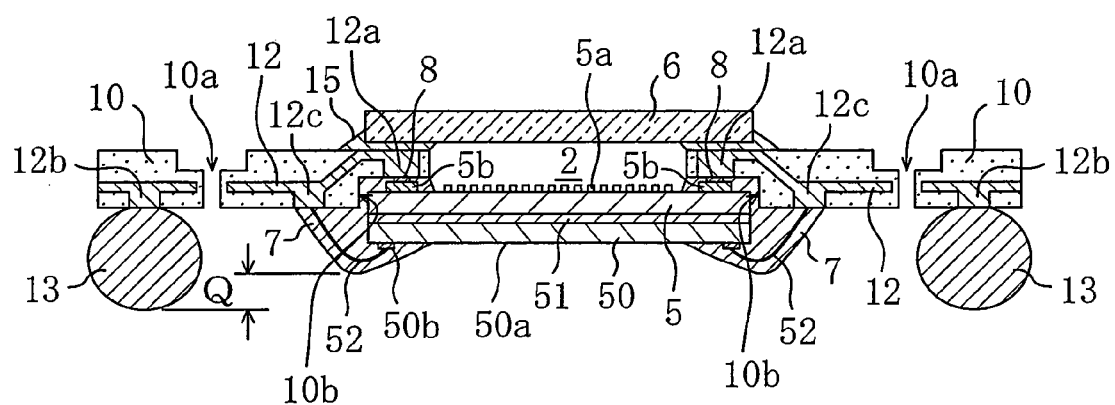
FIG. 1A is a sectional view of an optical device of a first embodiment, which is taken along the line IA-IA in FIG. 1B.
Figure 1B:
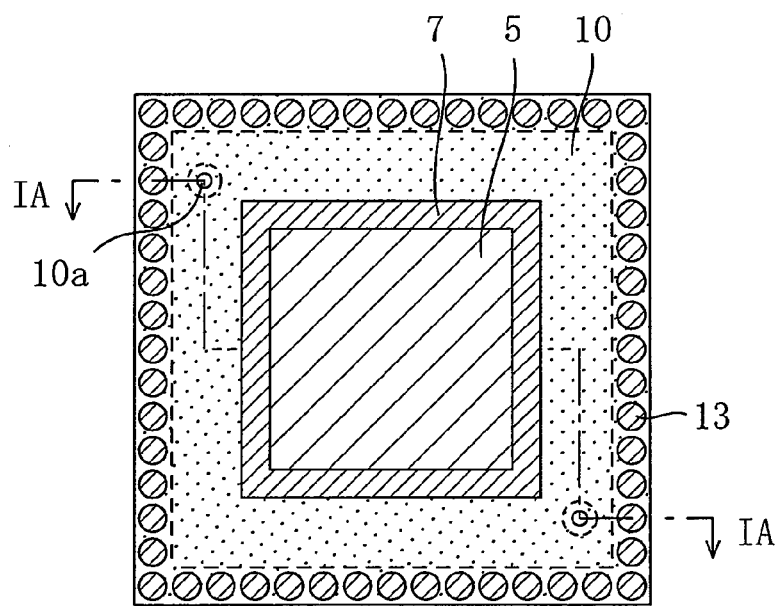
FIG. 1B is a backside view of the optical device.

FIG. 1A is a sectional view of an optical device of a first embodiment, which is taken along the line IA-IA in FIG. 1B, and FIG. 1B is a backside view of the optical device. Note that FIGS. 1A and 1B are illustrated on different scales.

Referring to FIGS. 1A and 1B, the optical device of the first embodiment includes a base 10, an optical element chip 5, an integrated circuit chip 50, a window member 6, and a solder ball 13. The base 10 of frame shape is made of plastic resin such as epoxy resin and has an opening 2 in its center portion. The optical element chip 5 is attached to the lower surface of the base 10. The integrated circuit chip 50 is disposed on the back surface of the optical element chip 5 with an insulator layer 51 of adhesive interposed therebetween. The window member 6 is a translucent member made of glass and attached to the upper surface of the base 10 so that the member faces the optical element chip 5 with the opening 2 interposed therebetween. The base 10 is a member for connecting the optical element chip of the optical device to the translucent member. This structure is constructed in such an order that a molding process is carried out and then the optical element chip is mounted on the base, so that this structure is referred to as a so-called pre-molded structure.

In the first embodiment, the optical element chip 5 mounts a solid-state image sensing element such as CCD, so that the optical device is a solid-state image sensing device used for a camcorder, a digital camera, a digital still camera, or the like.

However, instead of the solid-state image sensing element, the optical element chip may be a chip in which a plurality of light receiving elements are arranged discretely or a chip on which only a light emitting element is mounted. In such cases, the optical device is a light receiving device or a light emitting device disposed in an optical pickup for use in a system with a DVD, a CD, or an MD.

The integrated circuit chip 50 mounts an integrated circuit. The integrated circuit is a peripheral circuit of the optical element chip 5 such as a driver circuit, various kinds of logic circuits, a front-end circuit, and a timing generator, and a memory or the like.

Wires 12 are buried within the base 10. In a region of the lower surface of the base 10 located around the opening 2, one end of each wire 12 is exposed from a molding resin forming the base 10 and thereby serves as an internal terminal portion 12*a*. In the outer peripheral part of the lower surface of the base 10, the other end of each wire 12 is exposed from the molding resin forming the base 10 and thereby serves as an external terminal portion 12*b*. Some types of wires 12 have, at a position outside the internal terminal portion 12*a*, a midpoint terminal portion 12*c* exposed from the molding resin and provided instead of or together with the internal terminal portion 12*a*.

In this structure, each wire 12 is bent so that the internal terminal portion 12*a* is positioned above the other portions, and the lower surface of the base 10 is formed with a shoulder 10*b* whose upper level is on its upper region surrounding the opening 2. Around the internal terminal portion 12*a*, the upper surface of the base 10 has an equal level to the upper surface of the wire 12, and the lower surface of the base 10 has a substantially equal level to or a higher level than the lower surface of the internal terminal portion 12*a* of the wire 12. Such a structure is fabricated by employing a fabrication process as described later.

Two specific areas of the base 10 are formed with positioning holes 10*a* serving as a reference for determining the center position in the X and Y directions of the optical device. The positioning holes are used as a reference position in mounting a chip in a fabrication process described later and as a reference for the position to which a lens barrel with an optical system such as a lens incorporated therein is attached. If two or more positioning holes 1*a* are provided in the base, the center position of the optical device can be determined. Therefore, the holes can function as positioning. Alternatively, instead of the positioning holes 10*a*, positioning steps can be provided in the outer perimeter of the base 10 to carry out the same function. However, the fundamental effects of the present invention can be exerted even if no positioning means such as the positioning holes and the positioning steps is provided.

The optical element chip 5 is fixed to a region of the lower surface of the base 10 located around the opening 2 so that its main surface 5*a* with the light receiving region provided thereon is exposed in the opening 2. A portion of the main surface 5a of the optical element chip 5 located around its perimeter is provided with an electrode pad 5b for sending and receiving signals between the optical element chip 5 and external equipment. The internal terminal portion 12a of each wire 12 and the electrode pad 5b of the optical element chip 5 are electrically connected to each other with a bump (protruding electrode) 8 interposed therebetween.

The integrated circuit chip 50 is stacked on the back surface of the optical element chip 5 so that its main surface 50a formed with semiconductor elements such as transistors constituting the integrated circuit is directed downward. A portion of the main surface 50a of the integrated circuit chip 50 located around its perimeter is provided with an electrode pad 50b for sending and receiving signals between the integrated circuit chip 50 and the optical element chip S or external equipment. A fine metal wire 52 electrically connects the midpoint terminal portion 12c of each wire 12 to the corresponding electrode pad 50b.

The wires 12 include, for example, a wire connecting the internal terminal portion 12a to the external terminal portion 12b, a wire connecting the internal terminal portion 12a to the midpoint terminal portion 12c, a wire connecting the midpoint terminal portion 12c to the external terminal portion 12b, and a wire connecting the internal terminal portion 12a, the midpoint terminal portion 12c, and the external terminal portion 12b. FIG. 1A illustrates the wire 12 connecting the internal terminal portion 12a, the midpoint terminal portion 12c, and the external terminal portion 12b. The wire 12 is formed to make a detour around the positioning hole 10a.

On the lower surface of the base 10, the optical element chip 5, the integrated circuit chip 50, the wires 12, the fine metal wire 52, and the bump 8 are sealed with a sealing resin 7 provided around the optical element chip 5 and the integrated circuit chip 50. On the upper surface of the base 10, the gap between the base 10 and the window member 6 is filled with a sealing resin 15 provided around the window member 6. The inner space (the opening 2) of the device is hermetically sealed with the sealing resins 7 and 15 to form a package body.

In the first embodiment, the thickness of the whole package body is set at, for example, 2 mm or smaller. The dimension of the integrated circuit chip 50 ranges from 0.5 to 10 mm in length, from 0.5 to 10 mm in width, and from 0.05 to 0.3 mm in thickness. The dimension of the optical element chip 5 ranges from 0.5 to 10 mm in length, from 0.5 to 10 mm in width, and from 0.05 to 0.3 mm in thickness. The integrated circuit chip 50 may have almost the same dimension as the optical element chip 5, or a larger or smaller dimension than the optical element chip 5. This is because any of the cases can apply the structure in which the integrated circuit chip 50 is stacked above the optical element chip 5.

With the optical device of the first embodiment, the optical element chip 5 and the integrated circuit chip 50 with the integrated circuit mounted thereon can be integrated in one package form, so that a so-called SIP (system in package) can be attained. That is to say, a solid-state image sensing element, a light receiving device, a light emitting device, and the like, and the integrated circuit and the like for controlling them can be integrated in one package form to provide an optical device with a high integration. Moreover, a system of a camera or the like with the optical device incorporated therein can be totally downsized and manufacturing costs thereof can be reduced.

In particular, the optical element chip 5 and the integrated circuit chip 50 are bent up, which also exerts the following effects.

First, a sufficiently great difference between the lowermost surface of the sealing resin 7 and the lowermost surface of the solder ball 13, that is, a sufficiently great clearance Q can be secured. Particularly, by bending up the internal terminal portion 12a so that the upper surface of the internal terminal portion 12a has a substantially equal level to the upper surface of the base 10, the optical element chip 5 and the integrated circuit chip 50 can be set as upward as possible without increasing the thickness of the whole optical device. Therefore, widening of the clearance Q improves the reliability of connection of the solder ball 13 to a corresponding wire of a motherboard when the optical device is mounted on the motherboard. In addition, this setting can decrease the diameter of the solder ball 13, so that the height of the whole optical device can be reduced.

Second, the pad electrode 50b of the integrated circuit chip 50 is brought close to the midpoint terminal portion 12c of the wire 12, which reduces the difference in loop level of the fine metal wire 52. Therefore, a more accurate wire bonding can be conducted.

Third, the distance between the bottom surface of the window member 6 and the upper surface of the optical element 5 is reduced, which secures a wide range of lens movement for adjusting the focus length of the lens disposed above the window member 6. Therefore, design of the system with the optical device disposed therein can have an increased flexibility.

Fabrication Process of Optical Device

FIGS. 2A to 2G are sectional views showing process steps of fabricating an optical device according to the first embodiment of the present invention. Although only one optical device formation region is illustrated in the steps shown in FIGS. 2A to 2G, the fabrication process steps are actually implemented using a lead frame which has a number of optical device formation regions arranged in grid pattern.

FIGS. 3A and 3B are sectional views showing molding steps of the fabrication process of the optical device according to the first embodiment.

Figure 2A:
FIGS. 2A to 2G are sectional views showing process steps of fabricating an optical device according to the first embodiment.

First, in the step shown in FIG. 2A, a lead frame 12 formed with a wiring pattern is put on a sealing tape 20. Recesses made by half-etching or pressing are provided in the lower portion of most of the lead frame 12, and only portions to be formed into the internal terminal portion 12a, the external terminal portion 12b, and the midpoint terminal portion 12c protrude downward from the bottom surface of the recess. A portion of the sealing tape 20 located inside the region below the midpoint terminal portion 12c is cut off. However, another type of sealing tape may be used in which this portion is not cut off and the entire tape is continuous.

Subsequently, a molding process is conducted in the step shown in FIG. 2B. Specifically, as shown in FIGS. 3A and 3B, the lead frame (the wire 12) with the sealing tape 20 attached thereto is installed in a molding die 30. Die cavities 30a of the molding die 30 are filled with plastic resin (molding resin) such as epoxy resin, and all portions of the lead frame (the wire 12) but the internal terminal portion 12a, the external terminal portion 12b, and the midpoint terminal portion 12c are embedded in the molding resin to form the base 10. At this time, part of the lower die of the molding die 30 protrudes upward above the other portions at a location corresponding to a partition 30b for separating the die cavities 30a of the molding die 30 from each other, and the protruding part serves as a projection 30d. Resin sealing is carried out with the internal terminal portion 12a of the lead frame (the wire 12) mounted on the projection 30d and coming into contact with the upper die. The molding die 30 is provided with a pin member 30c for forming the positioning hole 10a of the optical device.

When the resin sealing is carried out using the molding die 30, the pin member 30c and the partition 30b separating the die cavities 30a of the molding die 30 are not charged with the molding resin. As a result, the optical device formation regions of the bases 10 are each formed with the positioning holes 10a and the opening 2 for attaching the optical element. Also, the base 10 is formed with the shoulder 10b of a shape matching the shape of the projection 30d. At the time of completion of this resin sealing, a molded structure is formed which is composed of the lead frame (the wire 12) and the base 10 and has a number of optical device formation regions.

Figure 2B:
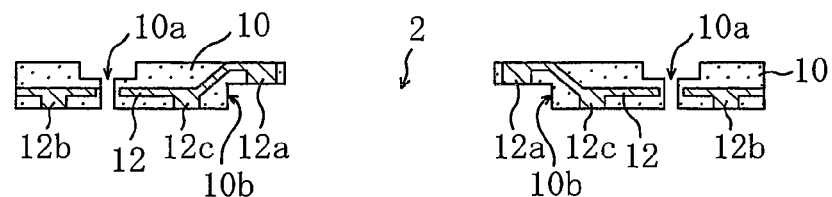
Figure 2C:
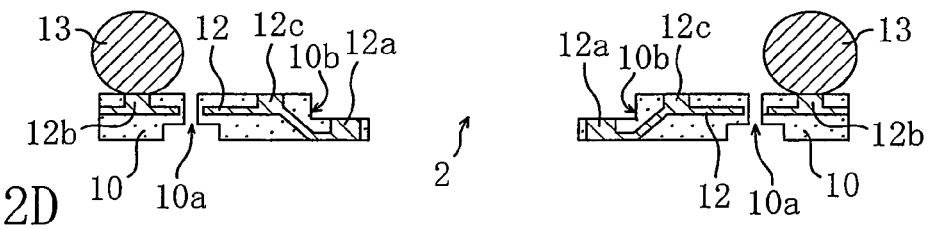

In the step shown in FIG. 2C, the sealing tape 20 is removed from the molded structure, and then the molded structure is placed so that the surface with the internal terminal portion 12a, the external terminal portion 12b, and the midpoint terminal portion 12c exposed therefrom is directed upward. The solder balls 13 are formed on the external terminal portions 12b, respectively.

Next, although not shown, the molded structure is split, with a blade, at the center of a dicing region located on the boundary between the adjacent optical device formation regions, thereby dividing the molded structure into individual parts to be optical devices.

Figure 2D:
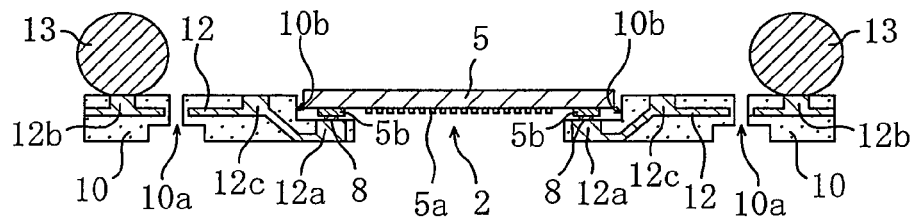

In the step shown in FIG. 2D, the optical element chip 5 is mounted above the base 10 so that its main surface 5a is directed downward. In this mount, the bumps 8 are provided on the internal terminal portions 12a of the base 10, respectively. The electrode pads 5b of the optical element chip 5 are connected onto the respective bumps 8, thereby forming flip-chip bonding. In this mount, the optical element chip 5 can be positioned using the positioning holes 10a as a reference.

Figure 2E:
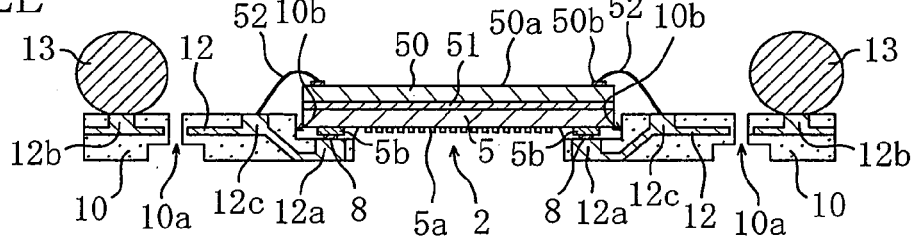

Next, in the step shown in FIG. 2E, the back surface of the optical element chip 5 is coated with adhesive, and on the coated surface, the integrated circuit chip 50 is mounted with its main surface 50a directed upward. The fine metal wire 52 connects the pad electrode 50b of the integrated circuit chip 50 to the midpoint terminal portion 12c of the corresponding wire 12. In this connection, the wire bonding process can be carried out by fixing in advance the position of the pad electrode 50b of the integrated circuit chip 50 using the positioning holes 10a as a reference.

Subsequently, in the step shown in FIG. 2F, the sealing resin 7 covers the base 10, the perimeters of the optical element chip 5 and the integrated circuit chip 50, the internal terminal portion 12a and the midpoint terminal portion 12c of the corresponding wire 12, the fine metal wire 52, the bumps 8, and the pad electrodes 5b and 50b, and also fills the gaps of the connection portions.

Figure 2F:
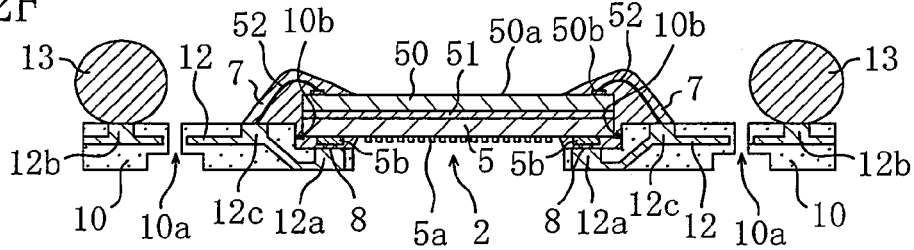
Figure 2G:
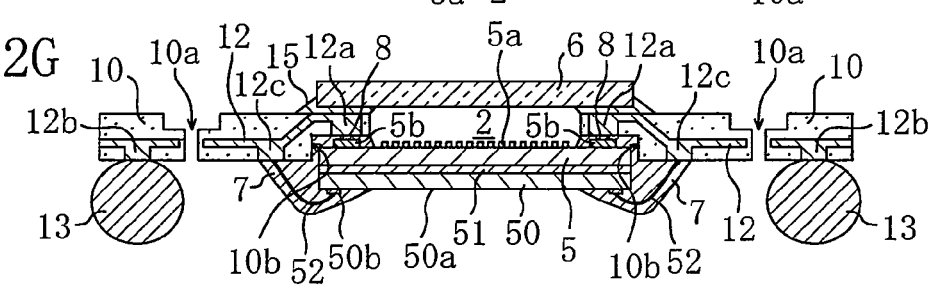

In the step shown in FIG. 2G, in the state in which the side of the base 10 with the optical element chip 5 and the integrated circuit chip 50 mounted thereon (the lower surface of the base 10) is directed downward, the window member 6 of glass covering the opening 2 is put above the upper surface of the resulting base 10. The sealing resin 15 seals the gap between the window member 6 and the base 10 to hermetically seal the opening 2.

In the fabrication method of the first embodiment, the pad electrode 5b of the optical element chip 5 and the internal terminal portion 12a of the corresponding wire 12 of the base 10 are connected to each other through the bump 8, and the integrated circuit chip 50 is mounted on the back surface of the optical element chip 5 with its main surface 50a directed downward, that is, the back surfaces of the integrated circuit chip 50 and the optical element chip 5 are superimposed with the insulator layer 51 interposed therebetween. Thereby, an optical device with a high integration can be fabricated.

Note that an alternative fabrication method can also be employed in which a through hole with a conductive member provided therein is formed in advance in the optical element chip 5 and the formed through hole electrically connects the pad electrode 50a of the integrated circuit chip 50 to the pad electrode Sb of the optical element chip 5. In this case, the fine metal wire 52 is unnecessary.

Particularly, in the fabrication method of the first embodiment, the resin sealing process is carried out with the internal terminal portion 12a put on the projection 30d of the molding die 30. Thereby, the internal terminal portion 12a of the lead frame can be bent up without separately adding a process for bending up the internal terminal portion 12a, such as a press process, and concurrently the shoulder 10b of a shape matching the shape of the projection 30d can be formed on the base 10. Moreover, the resin sealing is carried out while the internal terminal portion 12a is pressurized with tightening power of the upper and lower dies of the molding die 30 with the upper surface of the internal terminal portion 12a brought into contact with the lower surface of the upper die. Thereby, no resin burr is created in the internal terminal portion 12a.

Furthermore, the positioning holes boa formed in the base 10 can be used as a reference to fix the position of arrangement of the optical element chip 5 in the step shown in FIG. 2D, and the position of the pad electrode 50b of the integrated circuit chip 50 in the step shown in FIG. 2E. This improves the position accuracy of the optical axis of the optical element chip 5, the accuracy of symmetry of lengths of the fine metal wires in the wire bonding to the integrated circuit chip 50, and the like. Moreover, as described previously, after fabrication of the optical device, the positioning holes 10a can also be used to position the lens barrel of the optical system (to set the optical axis), which improves the accuracy of the whole optical device in performing a so-called tilt (two- or three-dimensional movement of the optical axis) and the position accuracy. As described previously, even though, instead of the positioning hole 10a, the positioning step is provided in the peripheral part of the base 10, the same effects can be exerted. Particularly, in the case where a through hole is provided therein, the hole is also suitable for use in a reference for positioning of the integrated circuit chip 50.

The split step can also be carried out after the attachment step of the optical element chip shown in FIG. 2F, or the attachment step of the window member 6 shown in FIG. 2G.

In the fabrication method of the first embodiment, the molding process is carried out with the lead frame put on the sealing tape, but the sealing tape does not necessarily have to be used. However, in the case where the sealing tape is used, the upper and lower surfaces of the lead frame can be clamped with the upper and lower dies to provide a stable state in which the surfaces of the dies are in tight contact with the upper and lower surfaces of the lead frame, respectively. As a result of this, the occurrence of resin burrs by molding is effectively suppressed, and the structure in which the external terminal portion protrudes from the sealing resin is produced. This facilitates and speeds up implementation of the optical device. For example, soldering is facilitated in attaching the optical device onto a motherboard.

Second Embodiment

Figure 4A:
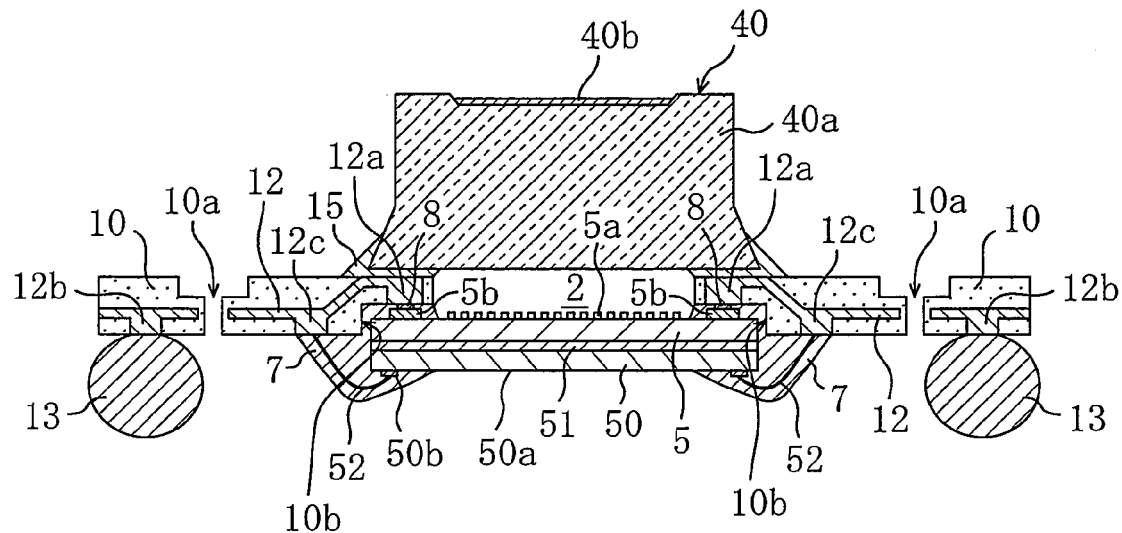
FIG. 4A is a sectional view of an optical device of a second embodiment, which is taken along the line IVA-IVA in FIG. 4B.
Figure 4B:
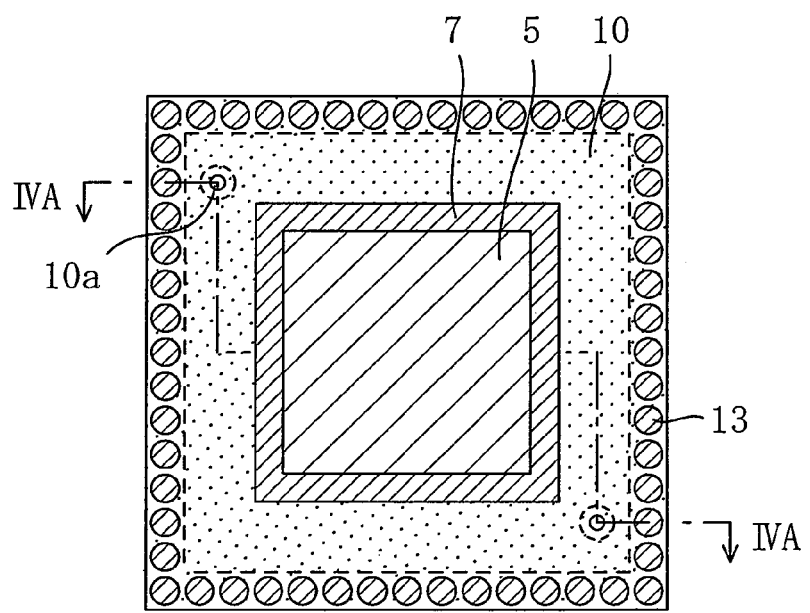
FIG. 4B is a backside view of the optical device.

FIG. 4A is a sectional view of an optical device of a second embodiment, which is taken along the line IVA-IVA in FIG. 4B, and FIG. 4B is a backside view of the optical device. Note that FIGS. 4A and 4B are illustrated on different scales.

Referring to FIGS. 4A and 4B, the optical device of the second embodiment includes a base 10, an optical element chip 5, an integrated circuit chip 50, a hologram 40, and a solder ball 13. The base 10 of frame shape is made of plastic resin such as epoxy resin and has an opening 2 in its center portion. The optical element chip 5 is attached to the lower surface of the base 10. The integrated circuit chip 50 is disposed on the back surface of the optical element chip 5 with an insulator layer 51 of adhesive interposed therebetween. The hologram 40 is a translucent member made of optical resin or the like and attached to the upper surface of the base 10 so that the hologram faces the optical element chip 5 with the opening 2 interposed therebetween. The base 10 is a member for connecting the optical element chip of the optical device to the hologram. This structure is constructed in such an order that a molding process is carried out and then the optical element chip is mounted on the base, so that this structure is referred to as a so-called pre-molded structure.

In the second embodiment, the optical element chip 5 mounts a light receiving element 5d and a light emitting element 5c such as a light emitting diode. The optical device is a hologram unit which incorporates a plurality of elements in an optical pickup for use in a system with a DVD, a CD, or an MD.

The integrated circuit chip 50 mounts an integrated circuit. The integrated circuit is a peripheral circuit of the optical element chip 5 such as a driver circuit, various kinds of logic circuits, a front-end circuit, and a timing generator, and a memory or the like.

The hologram 40 includes a main body 40a made of a translucent material such as optical resin and a hologram region 40b provided in the upper surface of the main body 40. By an adhesive 15, the perimeter and the lower surface of the main body 40a of the hologram 40 adhere to the upper edge of the base 10. The adhesive 15 fills the gap between the hologram 40 and the base 10.

The height of the hologram 40 ranges, for example, from 0.5 to 10 mm, and the thickness of the whole package body is set at, for example, 5 mm or smaller. The dimension of the integrated circuit chip 50 is identical to that in the first embodiment, and the dimension of the optical element chip 5 ranges from 0.5 to 5 mm in length, from 0.5 to 5 mm in width, and from 0.05 to 0.5 mm in thickness.

Wires 12 are buried within the base 10. In a region of the lower surface of the base 10 located around the opening 2, one end of each wire 12 is exposed from a molding resin forming the base 10 and thereby serves as an internal terminal portion 12a. In the outer peripheral part of the lower surface of the base 10, the other end of each wire 12 is exposed from the molding resin forming the base 10 and thereby serves as an external terminal portion 12b. Some types of wires 12 have, at a position outside the internal terminal portion 12a, a midpoint terminal portion 12c exposed from the molding resin and provided instead of or together with the internal terminal portion 12a.

In this structure, each wire 12 is bent so that the internal terminal portion 12a is positioned above the other portions, and the lower surface of the base 10 is formed with a shoulder 10b whose upper level is on its upper region surrounding the opening 2. Around the internal terminal portion 12a, the upper surface of the base 10 has an equal level to the upper surface of the wire 12, and the lower surface of the base 10 has a substantially equal level to or a higher level than the lower surface of the internal terminal portion 12a of the wire 12. Such a structure is fabricated by employing a fabrication process as described later.

Two specific areas of the base 10 are formed with positioning holes 10a serving as a reference for determining the center position in the X and Y directions of the optical device. The positioning holes are used as a reference position in mounting a chip in a fabrication process described later and as a reference for the position to which the hologram is attached. If two or more positioning holes 10a are provided in the base, the center position of the optical device can be determined. Therefore, the holes can function as positioning. Alternatively, even if, instead of the positioning holes 10a, positioning steps are provided in the outer peripheral part of the base 10 and the hologram is fit to these positioning steps, the same function can be accomplished. However, the fundamental effects of the present invention can be exerted even if no positioning means such as the positioning holes and the positioning steps is provided.

The optical element chip 5 is fixed to a region of the lower surface of the base 10 located around the opening 2 so that its main surface 5a with the light receiving region provided thereon is exposed in the opening 2. A portion of the main surface 5a of the optical element chip 5 located around its perimeter is provided with an electrode pad 5b for sending and receiving signals between the optical element chip 5 and external equipment. The internal terminal portion 12a of each wire 12 and the corresponding electrode pad 5b of the optical element chip 5 are electrically connected to each other with a bump (protruding electrode) 8 interposed therebetween.

The integrated circuit chip 50 is stacked on the back surface of the optical element chip 5 so that its main surface 50a formed with semiconductor elements such as transistors constituting the integrated circuit is directed downward. A portion of the main surface 50a of the integrated circuit chip 50 located around its perimeter is provided with an electrode pad 50b for sending and receiving signals between the integrated circuit chip 50 and the optical element chip 5 or external equipment. A fine metal wire 52 electrically connects the midpoint terminal portion 12c of each wire 12 to the corresponding electrode pad 50b.

The wires 12 include, for example, a wire connecting the internal terminal portion 12a to the external terminal portion 12b, a wire connecting the internal terminal portion 12a to the midpoint terminal portion 12c, a wire connecting the midpoint terminal portion 12c to the external terminal portion 12b, and a wire connecting the internal terminal portion 12a, the midpoint terminal portion 12c, and the external terminal portion 12b. FIG. 4A illustrates the wire 12 connecting the internal terminal portion 12a, the midpoint terminal portion 12c, and the external terminal portion 12b. The wire 12 is formed to make a detour around the positioning hole 10a.

On the lower surface of the base 10, the optical element chip 5, the integrated circuit chip 50, the wires 12, the fine metal wire 52, and the bump 8 are sealed with a sealing resin 7 provided around the optical element chip 5 and the integrated circuit chip 50. The inner space (the opening 2) of the device is hermetically sealed with the sealing resins 7 and 15 to form a package body. In this sealing, for a smooth implementation to a motherboard by a reflow of the solder ball 13, the bottom edge of the sealing resin 7 is located far above the bottom edge of the solder ball 13, so that a great clearance Q is secured.

With the optical device of the second embodiment, the optical element chip 5, the integrated circuit chip 50 with the integrated circuit mounted thereon, and the hologram 40 can be integrated in one package form, so that a so-called SIP (system in package) can be attained. That is to say, a light emitting element, a light receiving element, an integrated circuit for controlling these elements, and a hologram can be integrated in one package form to provide an optical device (hologram unit) with a high integration. Moreover, an optical pickup system with the hologram unit incorporated therein can be totally downsized and manufacturing costs thereof can be reduced.

Although illustration of the fabrication process of an optical device according to the second embodiment is omitted, the hologram 40 as an alternative to the window member 6 is attached to the base 10 in the step shown in FIG. 2G in the first embodiment. Thereby, the structure shown in FIGS. 4A and 4B can be fabricated readily. When the hologram is attached thereto, the position of the hologram region 40b of the hologram 40 can be fixed using the positioning holes 10a as a reference.

Accordingly, with the fabrication process of the second embodiment, in attaching the optical element chip 5, the integrated circuit 50, and the hologram 40, their positioning can be made using the positioning holes 10a as a reference. Therefore, the same effects as the fabrication method of the first embodiment can be exerted and concurrently the hologram unit with excellent X- and Y-accuracies can be fabricated.

Third Embodiment

Structure of Optical Device

Figure 5A:
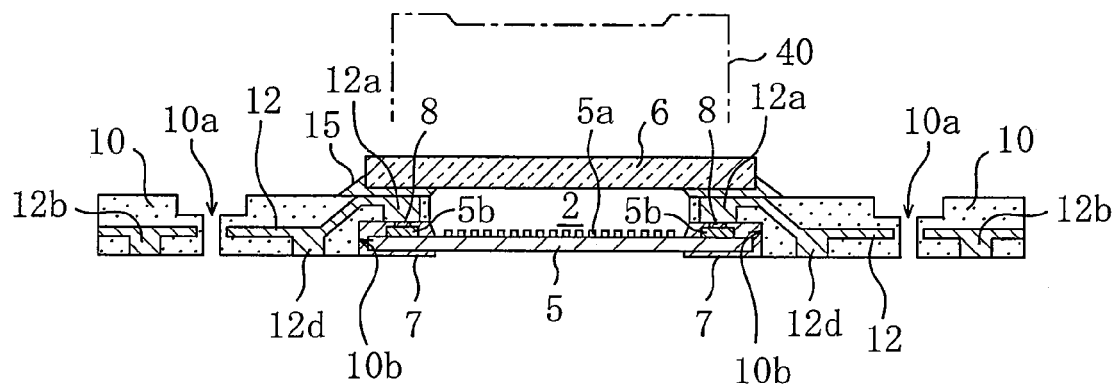
FIG. 5A is a sectional view of an optical device of a third embodiment, which is taken along the line VA-VA in FIG. 5B.
Figure 5B:
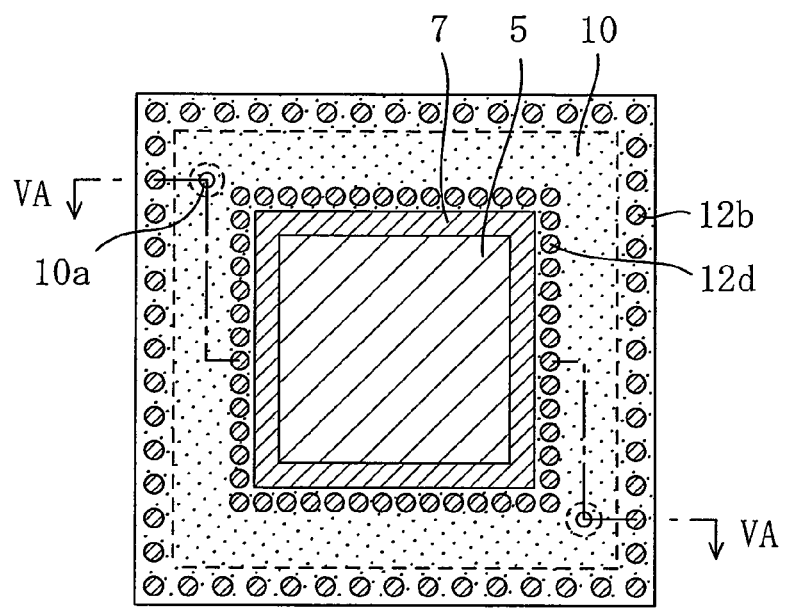
FIG. 5B is a backside view of the optical device.

FIG. 5A is a sectional view of an optical device of a third embodiment, which is taken along the line VA-VA in FIG. 5B, and FIG. 5B is a backside view of the optical device. Note that FIGS. 5A and 5B are illustrated on different scales.

Referring to FIGS. 5A and 5B, also in the optical device of the third embodiment, as in the case of the first embodiment, the internal terminal portion 12a of each wire 12 is bent up and the shoulder 10b is formed in a region of the lower surface of the base 10 surrounding the opening 2. That is to say, the region of the base 10 surrounding the opening 2 is thin, whereby the optical element chip 5 is bent up. The wires 12 are bent up so that the internal terminal portion 12a of each wire is positioned above other portions, and the lower surface of the base 10 is formed with the shoulder 10b whose upper level is on its upper region surrounding the opening 2. Around the internal terminal portion 12a, the upper surface of the base 10 has an equal level to the upper surface of the wire 12, and the lower surface of the base 10 has a substantially equal level to or a higher level than the lower surface of the internal terminal portion 12a of the wire 12. Such a structure is fabricated by employing the fabrication process of the first embodiment.

In the third embodiment, each wire 12 is provided with, instead of the midpoint terminal portion 12c in the first and second embodiments, a terminal portion 12d reinforced against bending. That is to say, the terminal portion 12d reinforced against bending prevents distortion and other troubles of the whole lead frame that are caused when the lead frame is bent.

In the third embodiment, the lower surface of the optical element chip 5 is located below the lower surfaces of the external terminal portion 12b and the terminal portion 12d reinforced against bending. Unlike the first and second embodiments, in the third embodiment, an integrated circuit chip, a fine metal wire, and a solder ball are not provided.

The structures of the other portions are identical to those in the description of FIGS. 1A and 1B in the first embodiment.

In the third embodiment, the lower surface of the optical element chip 5 is located below the lower surfaces of the external terminal portion 12b and the terminal portion 12d reinforced against bending. Therefore, even though no solder ball is provided, a solder reflow can be made with the external terminal portion 12b placed on a wire of a motherboard to provide electrical and mechanical connections between the terminal and the wire.

Thus, the distance between the bottom surface of the window member 6 and the upper surface of the optical element 5 is reduced, which secures a wide range of lens movement for adjusting the focus length of the lens disposed above the window member 6. Therefore, design of the system with the optical device disposed therein can have an increased flexibility.

Also in the third embodiment, a chip on which a light receiving element and a light emitting element such as a light emitting diode are mounted can be used as the optical element chip 5, and the hologram 40 (see the alternate long and short dashed line in FIG. 5A) as an alternative to the window member 6 can be used as the translucent member. In this case, the optical device is a hologram unit which incorporates a plurality of elements in an optical pickup for use in a system with a DVD, a CD, or an MD. Also in this case, provision of the positioning hole 10a (or a positioning step) in the base 10 improves the position accuracy of the hologram.

Fabrication Process of Optical Device

FIGS. 6A to 6E are sectional views showing process steps of fabricating an optical device according to the third embodiment of the present invention. Although only one optical device formation region is illustrated in the steps shown in FIGS. 6A to 6F, the fabrication process steps are actually implemented using a lead frame which has a number of optical device formation regions arranged in grid pattern.

Figure 6A:
FIGS. 6A to 6E are sectional views showing process steps of fabricating an optical device according to the third embodiment.
Figure 6B:
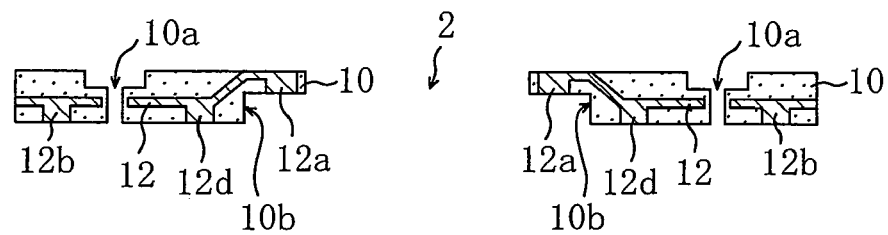
Figure 6C:
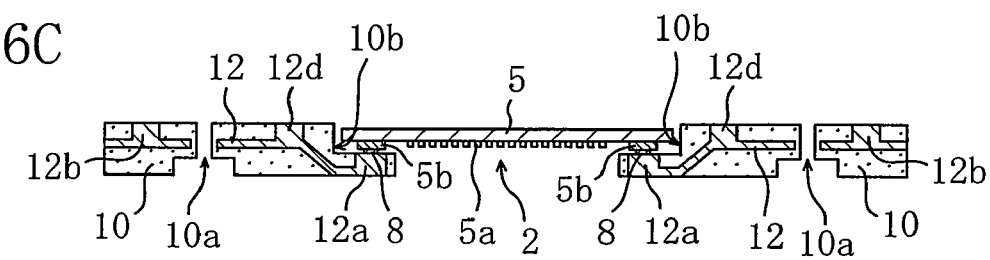
Figure 6D:
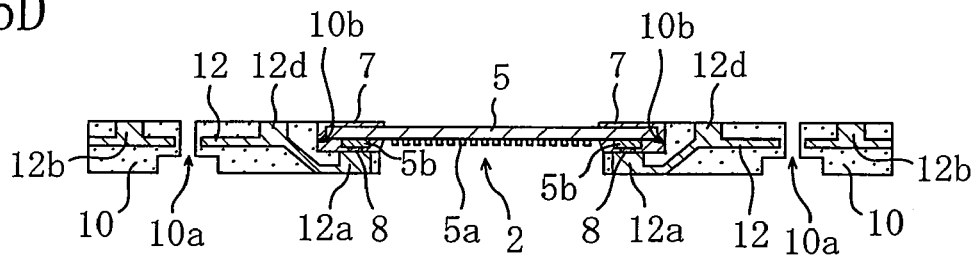
Figure 6E:
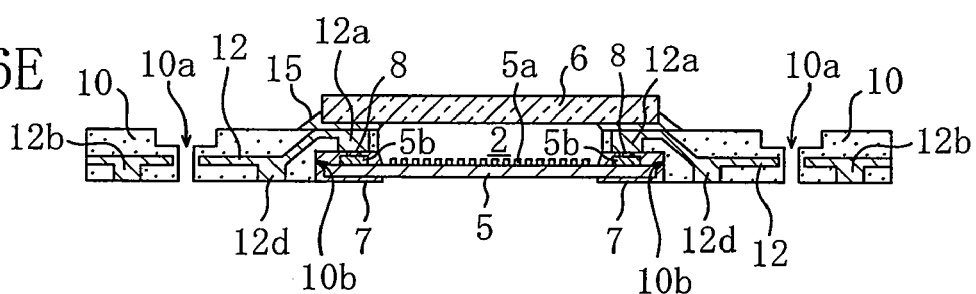
Figure 7:
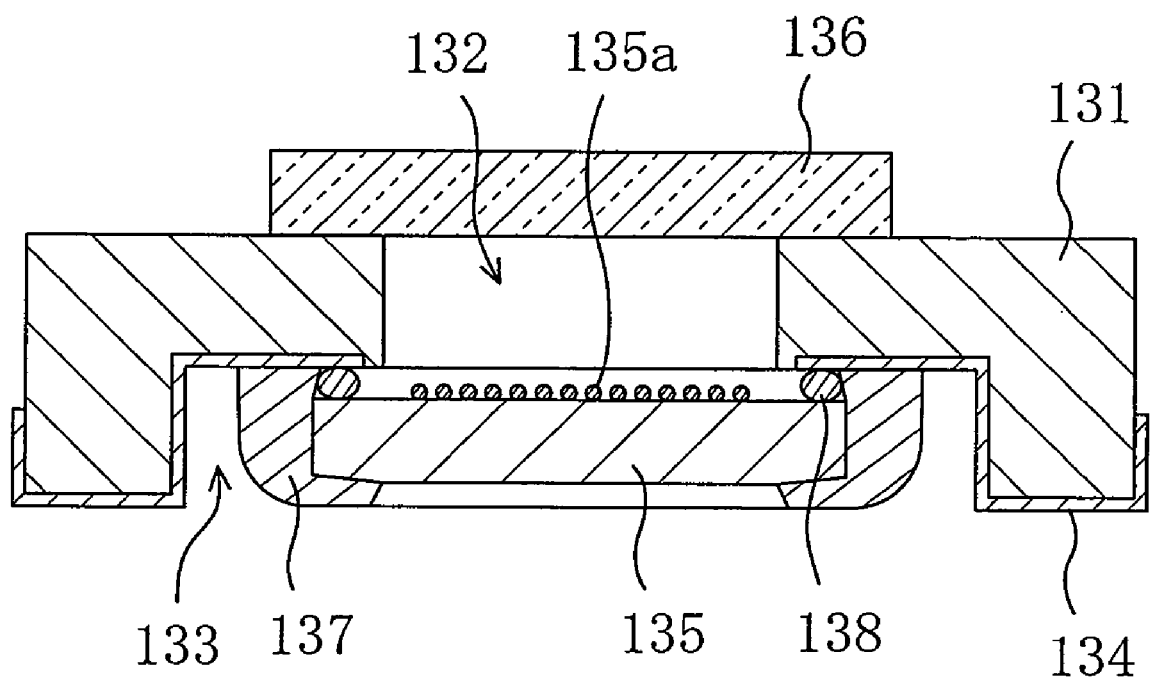
FIG. 7 is a sectional view showing the structure of a known optical device.

In the third embodiment, the steps shown in FIGS. 6A to 6C carry out the same steps as the steps shown in FIGS. 2A to 2C in the first embodiment.

However, no solder ball is provided in the third embodiment. Therefore, in the step shown in FIG. 6D, the optical element chip 5 is mounted. Subsequently to this, no integrated circuit chip is mounted, and the steps shown in FIGS. 6E and 6F carry out the same steps as the previously-described steps shown in FIGS. 2F and 2G in the first embodiment.

With the fabrication method of the third embodiment, the structure of the optical device shown in FIG. 5A can be fabricated. Particularly, in the step shown in FIG. 6B, resin sealing is carried out with the internal terminal portion 12a of the lead frame (the wire 12) put on the projection 30d of the lower die, whereby the shoulder 10b for bending up the optical device 5 can be formed easily without separately conducting a press process.

The optical device according to the present invention can be utilized as a component of a camcorder, a digital camera, a digital still camera, and the like, or as an optical pickup of a system for operating a DVD, a CD, an MD, and the like.

What is claimed is:

1. A method for fabricating an optical device, comprising steps in an order of:
    (a) of molding a lead frame with a wiring pattern to form a molded structure of bases with a plurality of optical device formation regions each surrounded by respective opening;
    (b) attaching, after the step (a), an optical element chip to each of the optical device formation regions so that the chip partially covers the opening, the optical device formation regions being located in the molded structure of the bases or in individual separated parts made by splitting the molded structure;

(c) partially sealing, after the step (b), the optical element chips and connecting portions of the molded structure or of the separated parts of the molded structure respectively with a first resin member;

(d) attaching, translucent members to the molded structure or the separated parts of the molded structure respectively so that each of the translucent members faces the corresponding optical element chip with the opening interposed therebetween; and (e) sealing, the translucent members and the molded structure of the bases or the separated parts with a second resin member, wherein in the step (a), a resin sealing is carried out with an internal terminal portion of the wiring pattern put on a projection of a lower die of molding dies and thereby sandwiched by an upper die and the lower die.

2. The method of claim 1,
wherein the optical element chip is flip-chip bonded to portions of the wiring pattern.

3. The method of claim 1, further comprising the step of attaching, after the step (b), an integrated circuit chip to the back surface of each of the optical element chips,
wherein in the step (c), the first resin member seals the optical element chips, the integrated circuit chips, and the connecting portions of the molded structure or of the separated parts of the molded structure.

4. The method of claim 1,
wherein in the step (a), resin molding is carried out with the lead frame with the wiring pattern placed on a sealing tape and installed in a molding die.

\* \* \* \* \*